United States Patent
Kubota et al.

(10) Patent No.: US 10,477,750 B2
(45) Date of Patent: Nov. 12, 2019

(54) COMPONENT MOUNTING METHOD AND COMPONENT MOUNTING DEVICE

(71) Applicant: FUJI CORPORATION, Chiryu (JP)

(72) Inventors: Tomokatsu Kubota, Anjo (JP); Yasushi Kato, Miyoshi (JP)

(73) Assignee: FUJI CORPORATION, Chiryu (JP)

( * ) Notice: Subject to any disclaimer, the term of this patent is extended or adjusted under 35 U.S.C. 154(b) by 314 days.

(21) Appl. No.: 15/500,708

(22) PCT Filed: Aug. 1, 2014

(86) PCT No.: PCT/JP2014/070345
§ 371 (c)(1),
(2) Date: Jan. 31, 2017

(87) PCT Pub. No.: WO2016/017029
PCT Pub. Date: Feb. 4, 2016

(65) Prior Publication Data
US 2017/0223881 A1    Aug. 3, 2017

(51) Int. Cl.
*H05K 3/32* (2006.01)
*H05K 13/04* (2006.01)
*H05K 13/08* (2006.01)

(52) U.S. Cl.
CPC ........ *H05K 13/046* (2013.01); *H05K 13/0404* (2013.01); *H05K 13/0408* (2013.01); *H05K 13/08* (2013.01); *H05K 13/0853* (2018.08)

(58) Field of Classification Search
CPC .... H05K 13/041; H05K 13/046; H05K 13/08; H05K 13/0404; H05K 3/303; H05K 3/30;
(Continued)

(56) References Cited

U.S. PATENT DOCUMENTS 4,146,924 A * 3/1979 Birk ................ B25J 9/1692
                                          318/568.13
4,412,293 A * 10/1983 Kelley ............. B25J 15/0266
                                            414/730
(Continued)

FOREIGN PATENT DOCUMENTS

EP    2 861 049 A1    4/2015
JP    2-219179    8/1990
(Continued)

OTHER PUBLICATIONS

Extended European Search Report dated Jul. 10, 2017 in Patent Application No. 14898630.0.
(Continued)

*Primary Examiner* — Peter Dungba Vo
*Assistant Examiner* — Kaying Kue
(74) *Attorney, Agent, or Firm* — Oblon, McClelland, Maier & Neustadt, L.L.P.

(57) ABSTRACT

A component mounting method for using a component mounting tool which includes a plurality of claw sections that pinch and pick up a component at a component supply position, and release the component on a board to mount the component onto a predetermined position of the board, and which is mounted to be capable of moving between the component supply position and the board, includes determining pinching locations of the component to be pinched by the plurality of claw sections such that positions and a release operation of the plurality of claw sections do not interfere with mounted components which are already mounted on the board when the plurality of claw sections release the component.

11 Claims, 4 Drawing Sheets

(58) Field of Classification Search
CPC ........... Y10T 29/5313; Y10T 29/53174; Y10T 29/53261; Y10T 29/53265; Y10T 29/4913; Y10T 29/49133
USPC ......... 29/713, 709, 729, 739, 740, 741, 722, 29/834, 832
See application file for complete search history.

(56) References Cited

U.S. PATENT DOCUMENTS

| | | | | |
|---|---|---|---|---|
| 4,434,550 | A | | 3/1984 | Wilke et al. |
| 4,598,456 | A | * | 7/1986 | McConnell ........ H05K 13/0812 29/407.04 |
| 4,663,821 | A | * | 5/1987 | Campisi ................. H05K 13/04 29/564.2 |
| 4,944,086 | A | * | 7/1990 | Nishihara .......... H05K 13/0473 29/837 |
| 5,215,923 | A | * | 6/1993 | Kinoshita ............. B25J 9/1612 414/783 |
| 5,903,663 | A | * | 5/1999 | Abend .................. G01N 27/84 348/159 |
| 6,161,214 | A | * | 12/2000 | Ishihara ............... G05B 19/408 716/119 |
| 8,813,349 | B2 | * | 8/2014 | In 'T Veld ........... B28D 5/0082 29/729 |
| 2003/0056363 | A1 | | 3/2003 | Yamamoto et al. |
| 2013/0133188 | A1 | * | 5/2013 | Suter .................. H05K 13/0404 29/740 |

FOREIGN PATENT DOCUMENTS

| | | |
|---|---|---|
| JP | 2774841 B2 | 7/1998 |
| JP | 2002-335097 | 11/2002 |
| JP | 2003-179394 A | 6/2003 |
| JP | 2004-221167 A | 8/2004 |
| JP | 2007-194673 | 8/2007 |
| JP | 4896757 B2 | 3/2012 |
| WO | WO 2013/183123 A1 | 12/2013 |

OTHER PUBLICATIONS

International Search Report dated Oct. 21, 2014 in corresponding PCT/JP2014/070345.
Office Action dated Jul. 10, 2018 in Japanese Patent Application No. 2016-537704 (with English language translation), 8 pages.

* cited by examiner

COMPONENT MOUNTING METHOD AND COMPONENT MOUNTING DEVICE

TECHNICAL FIELD

The present application relates to a component mounting method and a component mounting device of mounting a plurality of components onto a board. More specifically, the present application relates to a method and a device which avoid a component mounting tool which pinches a component interfering with mounted components.

BACKGROUND ART

Examples of devices which produce a board onto which multiple components are mounted include a solder printer, a component mounting machine, a reflow furnace, and a board inspection machine. There are many cases in which these devices are connected to configure a board production line. Ordinarily, the component mounting machine is provided with a board conveyance device, a component supply device, and a component transfer device. The component transfer device includes a component mounting tool which picks up a component from the component supplying device, conveys the component to the positioned board, and mounts the component, and a driving mechanism which drives the component mounting tool. A suction nozzle of a type which sucks a component using a negative pressure is a representative example of the component mounting tool. In the related art, a suction position at which the suction nozzle sucks the component is determined in advance based on the shape of each component. Ordinarily, the suction position of each component is set as the center of a body of the component, and thus, since the component is sucked to above the center of gravity, the suction operation and the mounting operation are stable.

In this type of component mounting machine, if the outer diameter of the suction nozzle is larger than the component to be sucked, there is a concern that an interference problem will occur when the suction nozzle performs the mounting operation on the board. In other words, there is a concern that a portion of the suction nozzle which protrudes from the component interferes with mounted components. A technological example of avoiding such suction nozzle interference is disclosed in PTL 1 and PTL 2.

In a case in which a holding tool (a suction nozzle) protrudes from side end surfaces of a mounting component and an already provided component (a mounted component) is present adjacent to the mounting position, the component mounting method of PTL 1 obtains an offset amount for ensuring that the holding tool does not interfere with the already provided component, and offsets a component supply section (a component supply position) and the holding tool by the offset amount when the holding tool holds the mounting component. Accordingly, it is purported that even if there are under narrow interval mounting conditions between the components, it is possible to avoid interference, and it is possible to suppress a reduction in productivity. A surface mounting machine of PTL 2 is also provided with an interference prevention process control means which is similar to the technology of PTL 1.

CITATION LIST

Patent Literature

PTL 1: JP-A-2002-335097
PTL 2: Japanese Patent No. 4896757

SUMMARY

Incidentally, for the component mounting tool, in addition to the suction nozzle, there is a mounting tool, known as a mechanical chuck nozzle, of a type which pinches a component using a plurality of claw sections. There is a mounting tool of a type in which suction using negative pressure and pinching using the claw sections is selected and functioned, in other words, there is a mounting tool which has both a suction nozzle and a mechanical chuck nozzle (known as an OF claw nozzle). In the mechanical chuck nozzle, the plurality of claw sections which pinch the side surfaces of the component always protrude from the component, and widen in the release operation during the mounting to further more greatly protrude from the component. Therefore, the interference of the mechanical chuck nozzle with the mounted components generally has an increased anticipated occurrence frequency in comparison to the interference with the suction nozzle which is disclosed in PTL 1 and PTL 2, and an avoidance method is difficult.

In the suction nozzle which is disclosed in PTL 1 and PTL 2, a single location is defined for the suction position of the components, whereas in the mechanical chuck nozzle, a plurality of pinching locations of components are defined. In other words, a method of specifying the relative positional relationship between the mechanical chuck nozzle and the component is different from the case of the suction nozzle. Therefore, even if the technology of avoiding the interference of the suction nozzle with the mounted components is reused for the mechanical chuck nozzle without change, this may not necessarily be effective. For example, if a pair of claw sections of the mechanical chuck nozzle pinch two short sides of a rectangular component, the pair of claw sections interfere with the mounted components; however, there is a case in which it is possible to avoid the interference by pinching the two long sides. Such an avoidance method may not be expressed using the method which specifies a single location for the suction position.

The present disclosure was made in consideration of the problems of the background art described above, and an object thereof is to solve providing a component mounting method which, in a case in which a component mounting tool which pinches a component using a plurality of claw sections is used, avoids the positions and the release operation of the plurality of claw sections interfering with the mounted components when a component is released on a board to enable the mounting of the component.

Problem to be Solved

The component mounting method according to a first aspect which solves the problem described above is a component mounting method for using a component mounting tool which includes a plurality of claw sections that pinch and pick up a component at a component supply position, and release the component on a board to mount the component onto a predetermined position of the board, and which is mounted to be capable of moving between the component supply position and the board, the method including determining pinching locations of the component to be pinched by the plurality of claw sections such that positions and a release operation of the plurality of claw sections do not interfere with mounted components which are already mounted on the board when the plurality of claw sections release the component.

The disclosure of the component mounting device according to a second aspect is a component mounting device includes a component mounting tool which has a plurality of claw sections that pinch and pick up a component at a component supply position, and release the component on a board to mount the component onto a predetermined position of the board, and which is mounted to be capable of moving between the component supply position and the board, and pinching location determination device for determining pinching locations of the component to be pinched by the plurality of claw sections such that positions and a release operation of the plurality of claw sections do not interfere with mounted components which are already mounted on the board when the plurality of claw sections release the component.

Advantageous Effects

According to the disclosure of the component mounting method according to the first aspect, it is possible to temporarily define the pinching locations of the component to be pinched by the plurality of claw sections based on the shapes, the dimensions of the parts, and the mounting coordinate positions on the board of the component to be mounted. It is possible to obtain the positions and the coordinate range of the release operation of the plurality of claw sections when the plurality of claw sections release the component on the board, and to determine whether or not the mounted component is interfered with. As a result of the determination, in a case in which interference does not occur, it is possible to adopt the pinching locations which are temporarily defined, and in a case in which interference occurs, it is possible to change the pinching locations which are temporarily defined to determine the final pinching locations such that interference does not occur. Accordingly, it becomes possible to avoid the interference and mount the component.

According to the disclosure of the component mounting device according to the second aspect, it is possible to carry out the disclosure of the component mounting method according to the first aspect. Therefore, even with the disclosure of the component mounting method according to the second aspect, the same effects arise as in the disclosure of the method according to the first aspect.

DESCRIPTION OF EMBODIMENTS

Description will be given of a component mounting method of a first embodiment of the present disclosure with reference to FIGS. 1 to 5. First, description will be given of the configuration of a component mounting machine and a mechanical chuck nozzle 1 which are used in the component mounting method of the first embodiment. Although omitted from the drawings, the component mounting machine is configured to include a board conveyance device, a component supply device, a component transfer device, and the like. The board conveyance device carries in the board, positions the board in a component mounting position, and carries out the board onto which the components are mounted. The component supply device sequentially supplies components to the component supply position. The component supply device includes a plurality of feeder devices which are lined up, for example.

Figure 1:
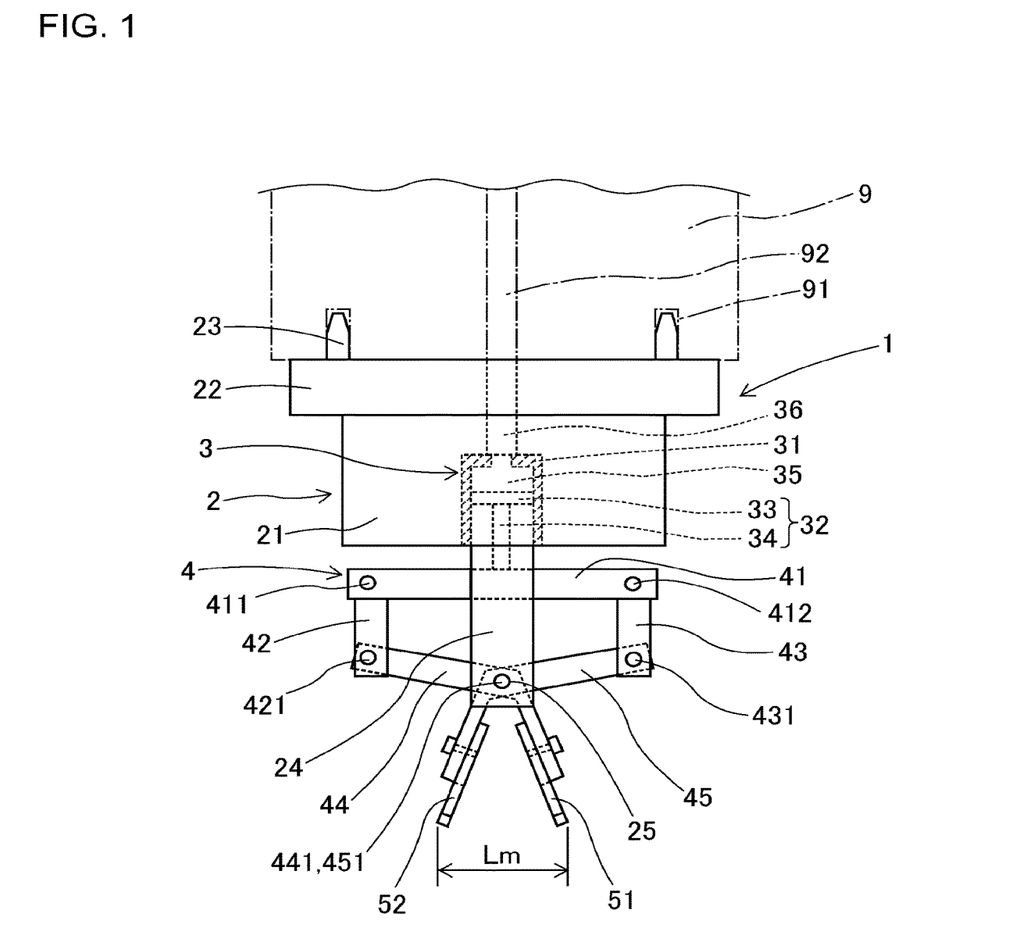
FIG. 1 is a front view illustrating the configuration of a mechanical chuck nozzle (a component mounting tool).

The component transfer device conveys a component which is picked up from the component supply position of the component supply device to a board which is positioned, and mounts the component at a predetermined mounting coordinate position on the board. The component transfer device is configured to include a suction nozzle and the mechanical chuck nozzle 1, a mounting head 9, an X-Y driving mechanism, and the like. The suction nozzle and the mechanical chuck nozzle 1 are attached to the mounting head 9 to be exchangeable. Not limited to the above, the suction nozzle and the mechanical chuck nozzle 1 may be attached to different mounting heads respectively, and may be attached to a single mounting head next to each other. The mounting head 9 is mounted to the X-Y driving mechanism to be capable of moving. The X-Y driving mechanism drives the mounting head 9 in two directions horizontally, and causes the suction nozzle and the mechanical chuck nozzle 1 to move between the component supply position and the board.

FIG. 1 is a front view illustrating the configuration of the mechanical chuck nozzle 1. The mechanical chuck nozzle 1 is an example of a component mounting tool of the present disclosure which pinches a component using a plurality of claw sections. As illustrated, the mechanical chuck nozzle 1 is mounted to the bottom side of the mounting head 9. The mechanical chuck nozzle 1 is configured to include a main body section 2, an air driving section 3, a pinching mechanism section 4, a pair of claw sections 51 and 52, and the like.

The main body section 2 includes a main body base section 21, an attachment flange section 22, and oscillating bearing sections 24. The main body base section 21 is a parallelepiped member. The attachment flange section 22 which is disc-shaped is provided integrally on the top side of the main body base section 21. A plurality of positioning protruding sections 23 are provided to stand on the upper surface of the attachment flange section 22. Each of the positioning protruding sections 23 fits into a corresponding one of a plurality of positioning holes 91 which are opened in the lower surface of the mounting head 9. The attachment flange section 22 is attached to the mounting head 9 in an attachable and detachable manner using a method such as screw fitting, a clamp mechanism, or suction using negative pressure. Accordingly, the rotational position and height position of the mechanical chuck nozzle 1 in relation to the mounting head 9 is determined. The upper surface of the attachment flange section 22 is closely sucked on the lower surface of the mounting head 9 and maintains airtightness. The oscillating bearing sections 24 are provided, with tension, as a front-rear pair downward from the front portion and the rear portion of the bottom side of the main body base section 21. A bearing point 25 is provided near to the bottom end of the oscillating bearing section 24.

The air driving section 3 is provided in the inner portion of the main body base section 21. The air driving section 3 includes an air cylinder 31, an air piston 32, and an air flow path 36. The air cylinder 31 is a bottomed cylindrical member which includes a bottom section on the top side and is open on the bottom. The air piston 32 is formed of a piston member 33 which slides vertically within the air cylinder 31, and a driving member 34 which extends downward from the piston member 33. A cylinder chamber 35 which has air-tightness is partitioned by the air cylinder 31 and the piston member 33. The air flow path 36 is formed upward penetrating the bottom section of the air cylinder 31. The air flow path 36 reaches the upper surface of the attachment flange section 22 and further communicates with an air supply and discharge path 92 of the mounting head 9. The air flow path 36 supplies air from an air supply and discharge section (not illustrated) which is provided in the mounting head 9 to the cylinder chamber 35, and discharges the air in the opposite direction.

The pinching mechanism section 4 is installed between the oscillating bearing sections 24 which are provided as a front-rear pair on the bottom side of the main body base section 21. The pinching mechanism section 4 is a link mechanism which includes a horizontal link member 41, vertical link members 42 and 43 which are a left-right pair, and a pair of finger members 44 and 45. The horizontal link member 41 extends in the paper surface left-right direction of FIG. 1. A middle portion of the horizontal link member 41 is fixed to the bottom end of the driving member 34 of the air piston 32. Horizontal bearing points 411 and 412 are provided on each of both ends of the horizontal link member 41. The vertical link members 42 and 43 which are a left-right pair extend in the vertical direction. The top ends of the vertical link members 42 and 43 are supported by the horizontal bearing points 411 and 412, respectively. Vertical bearing points 421 and 431 are provided on the bottom ends of the vertical link members 42 and 43, respectively.

Each of the pair of finger members 44 and 45 is a member which is bent into an "L" character shape. Oscillation fulcrums 441 and 451 are provided on the bend portions of the pair of finger members 44 and 45, respectively. The two oscillation fulcrums 441 and 451 are lined up in the obverse-reverse direction of the paper of FIG. 1, and are supported by the bearing point 25 of the oscillating bearing sections 24. The pair of finger members 44 and 45 are disposed to intersect. In other words, the first finger member 44 is supported by the vertical bearing point 421 of the vertical link member 42, the top end of which is the left side in the diagram, and the bottom portion extends down to the right in the diagram. The second finger member 45 is supported by the vertical bearing point 431 of the vertical link member 43, the top end of which is the right side in the diagram, and the bottom portion extends down to the left in the diagram. The pair of finger members 44 and 45 oscillate around the oscillation fulcrums 441 and 451, respectively.

The bottom portions of the pair of finger members 44 and 45 expand in an inverted letter "V" shape. The claw sections 51 and 52 are screw fixed to the surfaces of the bottom portions of the pair of finger members 44 and 45 which face each other, respectively. The pair of claw sections 51 and 52 are capable of being exchanged according to the type or the like of the component to be pinched.

When air is supplied to the cylinder chamber 35 and is pressurized, the air piston 32 is lowered to push the horizontal link member 41 down. The horizontal link member 41 and the left-right pair of vertical link members 42 and 43 are lowered together, and push the top ends of the pair of finger members 44 and 45 down. The first finger member 44 oscillates counterclockwise in the diagram, and the second finger member 45 oscillates clockwise in the diagram. Accordingly, the mutual interval between the pair of claw sections 51 and 52 widens to perform the release operation. In FIG. 1, the released state of the pair of claw sections 51 and 52 is illustrated, and a releasing dimension between the claw sections 51 and 52 is Lm.

Conversely, when the air of the cylinder chamber 35 is discharged and pressure is reduced, the air piston 32 rises to lift the horizontal link member 41 up. The horizontal link member 41 and the left-right pair of vertical link members 42 and 43 rise together, and lift up the top ends of the pair of finger members 44 and 45. The first finger member 44 oscillates clockwise in the diagram, and the second finger member 45 oscillates counterclockwise in the diagram. Accordingly, the mutual interval between the pair of claw sections 51 and 52 narrows to pinch and pick up the component. The opening and closing operations of the pair of claw sections 51 and 52 may be driven by a driving mechanism other than the air driving section 3, for example, a motor, an electromagnetic solenoid, or the like.

Next, description will be given of the component mounting method of the first embodiment. In the component mounting method of the first embodiment, the pinching locations of the component to be pinched by the pair of claw sections 51 and 52 is determined such that the positions and release operation of the pair of claw sections 51 and 52 do not interfere with the mounted components which are mounted on the board when the mechanical chuck nozzle 1 releases the component. The component mounting method of the first embodiment is realized by a calculation process function of software of a computer, and is carried out before the production of the board is started. The calculation results the computer obtains by carrying out the component mounting method of the first embodiment are passed from the computer to a control section of the component mounting machine. Accordingly, the component transfer device of the component mounting machine is capable of avoiding interference and mounting a component.

In the component mounting method of the first embodiment, the standard pinching locations at which the pair of claw sections 51 and 52 ordinarily pinch are determined to be on the side surfaces of the body of each of the components. The standard pinching locations of each of the components are defined using body center data and standard angle data. The body center data indicates the position of the center of the body of the component. The standard angle data indicates a directional angle at which the standard pinching location is positioned using the center of the body as a reference. The reference of the directional angle sets the long side direction of the component external shape to the X-axis direction, and a case in which the two claw sections 51 and 52 are positioned in the positive direction and the negative direction of the X axis as viewed from the center of the body is set to a directional angle 0°. Therefore, a case in which the two claw sections 51 and 52 are positioned in the positive direction and the negative direction of the Y-axis as viewed from the center of the body is set to a directional angle 90°.

Figure 2:
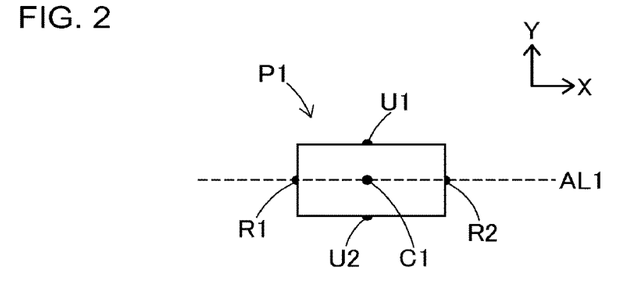
FIG. 2 is a plan view illustrating, in an exemplary manner, standard pinching locations of a rectangular component.

Description will be given of the standard pinching location described above using a specific example. FIG. 2 is a plan view illustrating, in an exemplary manner, standard pinching locations R1 and R2 of a rectangular component P1. In the rectangular component P1, the external shape of the body matches the component external shape. Therefore, the body center data of the rectangular component P1 represents a position of a center C1 of the component external shape which is illustrated. The standard angle data of the rectangular component P1 is defined as a directional angle 0°. Therefore, if an auxiliary line AL1 which is parallel to the X-axis is drawn through the center C1 of the component external shape, the intersection points between the auxiliary line AL1 and the component external shape surface become the standard pinching locations R1 and R2. The standard pinching locations R1 and R2 lie on the side surfaces of the middle points of the short sides of the rectangular component P1. Hypothetically, if the standard angle data of the rectangular component P1 is defined as a directional angle 90°, standard pinching locations U1 and U2 lie on the side surfaces of the center points of the long sides of the rectangular component P1. In this manner, when the component P1 is pinched from both sides so as to interpose the center C1 of the component P1, the posture of the component P1 is stable, and the pick up operation (pinching operation) and the mounting operation (release operation) are stabilized.

Figure 3:
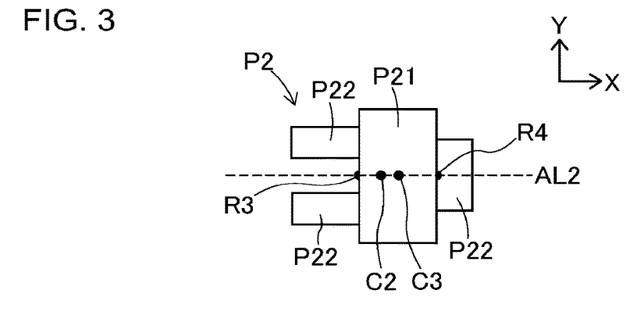
FIG. 3 is a plan view illustrating, in an exemplary manner, standard pinching locations of a component in which terminal sections protrude from the body.

FIG. 3 is a plan view illustrating, in an exemplary manner, standard pinching locations R3 and R4 of a component P2 in which terminal sections P22 protrude from a body P21. The component P2 is formed such that three low-height terminal sections P22 protrude in a non-symmetrical shape from the body P21 which is high. Therefore, the external shape of the body P21 does not match the component external shape in the component P2. The parts which protrude from the body P21 are not limited to the terminal sections P22. When the component P2 is pinched by the pair of claw sections 51 and 52, the side surfaces of the body P21 are pinched in order to stabilize the pick up operation and the mounting operation.

A center C2 of the component external shape of the component P2 is used for the purpose of specifying the mounting coordinate position. In comparison, the body center data of the component P2 represents the position of a center C3 of the rectangular body P21. The standard angle data of the component P2 is defined as a directional angle 0°. Therefore, if an auxiliary line AL2 which is parallel to the X-axis is drawn through the center C3 of the body P21, the intersection points between the auxiliary line AL2 and the body external shape surface become the standard pinching locations R3 and R4. The control section of the component mounting machine obtains the deviation amount of the center C3 of the body P21 in relation to the center C2 of the component external shape, that is, the center deviation amount and reflects the center deviation amount in the mounting operation of the component.

The computer ordinarily determines the pick up conditions at the component supply position such that the pair of claw sections 51 and 52 of the mechanical chuck nozzle 1 pinch the standard pinching locations R1 to R4 of the components P1 and P2. However, it is an exception in the case in which the pair of claw sections 51 and 52 interfere with the mounted components when pinching the standard pinching locations R1 to R4 of the components P1 and P2. In this case, the computer changes the pinching locations of the components P1 and P2 from the standard pinching locations R1 to R4 and determined the pick up conditions at the component supply position so as to avoid interference.

Figure 4:
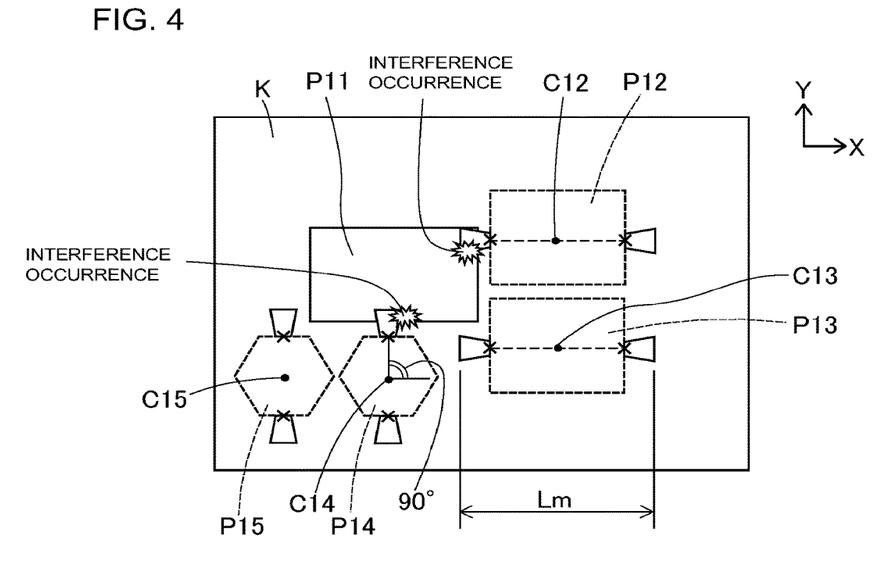
FIG. 4 is a plan view of a board illustrating, in an exemplary manner, cases in which a pair of claw sections of the mechanical chuck nozzle interfere with mounted components if pinching the standard pinching locations of the components.
Figure 5:
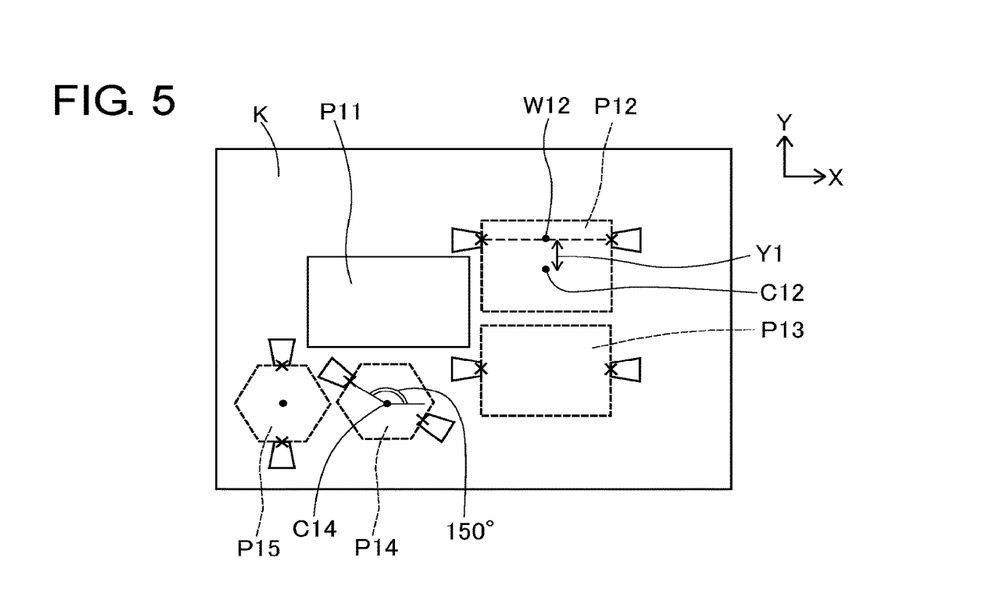
FIG. 5 is a plan view of the board illustrating, in an exemplary manner, a function of changing pinching locations of the component from the standard pinching locations to avoid interference.

Description will be given of the functions of the computer described above using a specific example. FIG. 4 is a plan view of a board K illustrating, in an exemplary manner, cases in which the pair of claw sections 51 and 52 of the mechanical chuck nozzle 1 interfere with mounted components if pinching the standard pinching locations of the components. FIG. 5 is a plan view of the board K illustrating, in an exemplary manner, a function of changing the pinching locations of the components from the standard pinching locations to avoid interference. In the specific example, a large component P11, two rectangular components P12 and P13, and two hexagonal components P14 and P15 are mounted onto the board K in the denoted order. The two rectangular components P12 and P13, and the two hexagonal components P14 and P15 are mounted using the mechanical chuck nozzle 1.

The body center data of the rectangular components P12 and P13 represents centers C12 and C13 of the component external shapes. The standard angle data of the rectangular components P12 and 13 is defined as a directional angle 0°. According to this definition, the standard pinching locations of the rectangular components P12 and P13 are the side surfaces of the two short sides. The body center data of the hexagonal components P14 and P15 represents centers C14 and C15 of the component external shapes. The standard angle data of the hexagonal components P14 and P15 is defined as a directional angle 90°. According to this definition, the standard pinching locations of the hexagonal components P14 and P15 are the two side surfaces which are parallel to the X-axis.

The computer is capable of obtaining the component arrangement state which is depicted in FIG. 4 based on the shapes, the dimensions of the parts, and the mounting coordinate positions on the board K of the components P11 to P15. In FIG. 4, the large component P11 which is mounted first is illustrated in solid lines as the mounted component P11, and the components P12 to P15 which are mounted second and after are depicted using dashed lines. As illustrated, the two rectangular components P12 and P13 are disposed to line up on the right side of the large component P11 in the diagram, and the two hexagonal components P14 and P15 are disposed to line up on the bottom side of the large component P11 in the diagram.

The computer is capable of obtaining the positions of the pair of claw sections 51 and 52 (the standard pinching locations) and the coordinate range of the release operation if the pair of claw sections 51 and 52 release the components P12 to P15 based on the body center data and the standard angle data corresponding to each of the components P12 to P15 which are mounted second and after. In FIG. 4, the positions and the coordinate range of the release operation of the pair of claw sections 51 and 52 are depicted by a pair of isosceles trapezoids which face each other. The positional relationship between the pair of isosceles trapezoids corresponds to the releasing dimension Lm depicted in FIG. 1.

As illustrated in FIG. 4, if the pair of claw sections 51 and 52 pinch the standard pinching locations of the rectangular component P12, one of the claw sections interferes with the mounted component P11. If the pair of claw sections 51 and 52 pinch the standard pinching locations of the hexagonal component P14, one of the claw sections interferes with the mounted component P11. Even if the pair of claw sections 51 and 52 pinch the standard pinching locations of the rectangular component P13 and the hexagonal component P15, interference does not occur. Therefore, the computer targets the rectangular component P12 and the hexagonal component P14 for which interference occurs, changes the pinching locations from the standard pinching locations, and avoids the interference as illustrated in FIG. 5. For the rectangular component P13 and the hexagonal component P15 for which interference does not occur, the computer determines that the standard pinching locations are to be pinched.

When changing the pinching locations from the standard pinching locations, the computer performs changing of at least the pinching center deviation data and angle data. The pinching center deviation data is data indicating the deviation amount of the pinching center which is deviated from the center of the body of the component. The pinching center deviation data may be represented using the deviation amount in the X-axis direction and the deviation amount in the Y-axis direction, and is not limited thereto. In non-zero data in which at least one of the deviation amounts in the X-axis direction and the Y-axis direction is not zero, the pinching center is deviated from the center of the body. The angle data is data indicating the directional angel at which the pinching locations lie, based on the pinching center as a reference.

When not changing the pinching locations from the standard pinching locations, the computer set the pinching center deviation data as zero data. In other words, the computer sets the deviation amounts of the X-axis direction and the Y-axis direction both to zero. The computer causes the angle data to match the standard angle data. As can be understood from the explanation hereunto, the computer corresponds to pinching location determination device of the present disclosure.

In the specific example of FIG. 5, the computer sets the deviation amount in the X-axis direction of the pinching center deviation data relating to the rectangular component P12 to zero, and sets a deviation amount Y1 in the Y-axis direction. Accordingly, a pinching center W12 deviates by the deviation amount Y1 in the Y-axis direction from the center C12 of the component external shape of the rectangular component P12. The computer causes the angle data relating to the rectangular component P12 to match the standard angle data. Therefore, the positions and the coordinate range of the release operation of the pair of claw sections 51 and 52 which pinch the rectangular component P12 are displaced by Y1 in the Y-axis direction, and the interference is avoided. The pinching center deviation data described above is applied to the pick up conditions at the component supply position. Accordingly, the relative positional relationship between the rectangular component P12 at the component supply position and the pair of claw sections 51 and 52 changes by the deviation amount Y1 from ordinary, and the pick up operation is performed.

The computer may set the pinching center deviation data relating to the rectangular component P12 to zero data, and may change the angle data to a directional angle 90°. In this case, the pinching locations of the pair of claw sections 51 and 52 are modified to the side surfaces of the two long sides of the rectangular component P12. Since the rectangular component P13 is yet to be mounted, the interference of the pair of claw sections 51 and 52 is avoided.

The computer sets the pinching center deviation data relating to the hexagonal component P14 to zero data, and sets the angle data to a direction angle 150° to make the direction angle different from a directional angle 90° of reference angle data. Accordingly, the pinching locations of the pair of claw sections 51 and 52 which pinch the hexagonal component P14 are modified from the side surfaces of the standard pinching locations to the side surfaces which are adjacent thereto counterclockwise, and the interference is avoided. The angle data which is described above is applied to the pick up conditions of the component supply position. Accordingly, the relative angle relationship between the hexagonal component P14 at the component supply position and the pair of claw sections 51 and 52 changes by 60° (=150°−90°) from ordinary, and the pick up operation is performed.

The component mounting method of the first embodiment is a component mounting method for using the mechanical chuck nozzle 1 which includes the pair of claw sections 51 and 52 that pinch and pick up a component at a component supply position, and release the component on a board to mount the component onto a predetermined position of the board, and which is mounted to be capable of moving between the component supply position and the board, the method including determining pinching locations of the components P12 to P15 to be pinched by the pair of claw sections 51 and 52 such that positions and a release operation of the pair of claw sections 51 and 52 do not interfere with the mounted component P11 which is already mounted on the board K when the pair of claw sections 51 and 52 release the components P12 to P15.

Accordingly, it is possible to temporarily define the pinching locations of the components P12 to P15 which are pinched by the pair of claw sections 51 and 52 as the standard pinching locations based on the shapes, the dimensions of the parts, and the mounting coordinate positions on the board K of the components P12 to P15 to be mounted. It is possible to obtain the positions and the coordinate range of the release operation of the pair of claw sections 51 and 52 when the pair of claw sections 51 and 52 release the components P12 to P15 on the board K, and to determine whether or not the mounted component P11 is interfered with. As a result of the determination, in a case in which interference does not occur, it is possible to adopt the standard pinching locations, and in a case in which interference occurs, it is possible to change the standard pinching locations to determine the final pinching locations such that interference does not occur. Accordingly, it becomes possible to avoid the interference and mount the components P12 to P15.

In the component mounting method of the first embodiment, standard pinching locations at which the component is ordinarily pinched by the pair of claw sections 51 and 52 are defined, and in a case in which at least one of positions and a release operation of the pair of claw sections 51 and 52 interferes with the mounted component P11 if the pair of claw sections 51 and 52 pinch the standard pinching locations of the components P12 and P14, pinching locations of the components P12 and P14 are changed from the standard pinching locations to avoid interference.

Accordingly, ordinarily, the standard pinching locations at which it is possible to stabilize the pick up operation and the mounting operation are used, and the pinching locations are changed from the standard pinching locations limited to when interference occurs. Therefore, it is possible to reliably avoid interference while maintaining the stability of the pick up operation and the mounting operation.

In the component mounting method of the first embodiment, the standard pinching locations of the components P12 to P15 are defined as side surfaces of bodies of the components P12 to P15, and are defined using body center data which indicates centers of the bodies (the centers C12 to C15 of the component external shapes), and standard angle data which indicates directional angles at which the standard pinching locations lie based on the centers of the bodies as references, the pinching locations of the components P12 and P14 are defined using pinching center deviation data which indicates a deviation amount of the pinching center W12 which is deviated from the center of the body of the component P12 (the center C12 of the component external shape), and angle data which indicates the directional angles at which the pinching locations lie based on the pinching center as a reference, the pinching center deviation data is set to zero data and the angle data is caused to match the standard angle data when the pinching locations of the components P13 and P15 are not changed from the standard pinching locations, and at least one change of a pinching center change in which the pinching center deviation data is set to non-zero data and an angle change in which the angle data is set to data which is different from the standard angle data is performed when the pinching locations of the components P12 and P14 are changed from the standard pinching locations.

Accordingly, since at least one of the pinching center changing and the angle changing is performed according to the component arrangement state on the board K, it is possible to select an effective avoidance method and reliably avoid interference. Even in the component P2 which has a protruding part, it is possible to reliably avoid interference while maintaining stability of the pick up operation and the mounting operation by pinching the body P21.

A combination of the component transfer device which is provided with the mechanical chuck nozzle 1, and a computer which corresponds to the pinching location determination device configures the component mounting device of the embodiment of the present disclosure. The component mounting device of the embodiment is capable of carrying out the component mounting method of the first embodiment. Therefore, even in the component mounting device of the embodiment, the same effect occurs as in the component mounting method of the first embodiment.

Next, description will be given of the component mounting method of the second embodiment. The configuration of the component mounting machine and the mechanical chuck nozzle 1 which are used in the component mounting method of the second embodiment is the same as in the first embodiment. In the component mounting method of the second embodiment, when the pair of claw sections 51 and 52 of the mechanical chuck nozzle 1 interfere with the mounted components, a first method and a second method are compared, and the method with which the interference is avoided is determined. The first method is a method of changing the pinching locations of the component from the standard pinching locations which is described in the first embodiment. The second method is a method of changing the mounting order of the plurality of components.

Figure 6:
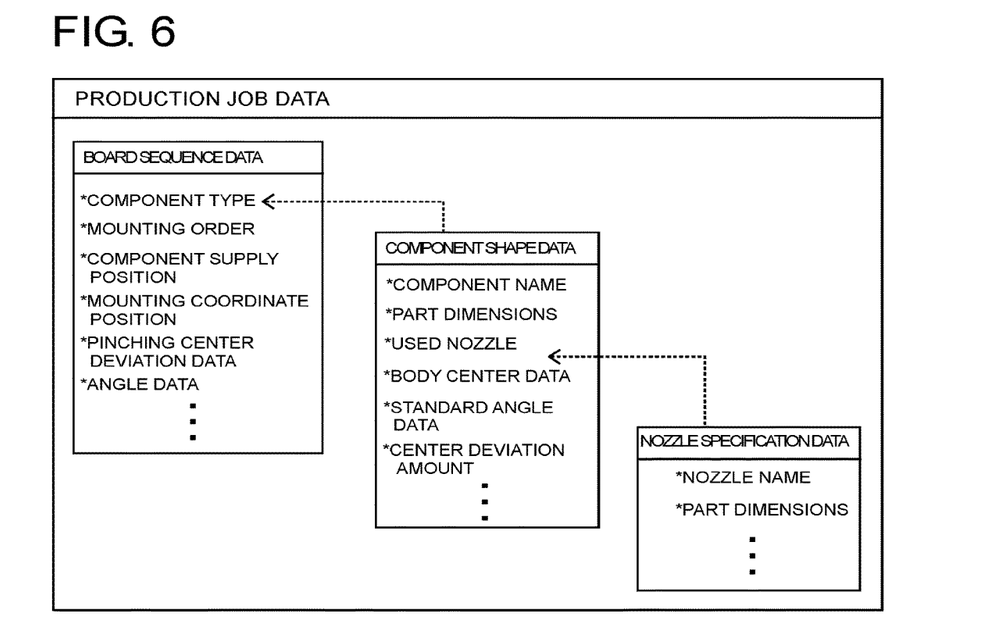
FIG. 6 is a diagram schematically illustrating a portion of the data structure of production job data.

First, description will be given of the production job data which serves as the foundation of the control when producing the board. FIG. 6 is a diagram schematically illustrating a portion of the data structure of the production job data. The production job data is configured to be based on the board sequence data, and such that multiple items of data such as component shape data and nozzle specification data are organically linked. The items of data may be held in collective manner in a single location, or alternatively the items of data may be distributed over a plurality of locations, and held to be mutually accessible. Naturally, the computer which performs the calculation process of the component mounting method of the second embodiment holds the production job data, or is capable of accessing the production job data.

The board sequence data is produced for each type of the board K to be produced. A plurality of types of component to be mounted on the board K, the mounting order, the component supply position, and the mounting coordinate position are defined in the board sequence data. The pinching center deviation data and the angle data which are necessary for determining the pick up conditions at the component supply position are also defined in the board sequence data. As described later, the board sequence data is finally determined by the calculation processes of optimization and interference avoidance which are carried out by the computer.

The component shape data is linked to the type of the component in the board sequence data. The component shape data is data which is unique to each type of component, and is shared over a plurality of items of board sequence data. The component name, the part dimensions, the used nozzle, and the like are indicated in the component shape data. The used nozzle is the nozzle which is used in a standard manner for picking up the relevant component. The body center data, the standard angle data, and the center deviation amount which indicate the standard pinching locations are also defined in the component shape data.

The nozzle specification data is linked to the used nozzle in the component shape data. The nozzle specification data is data which is unique to each type of nozzle, and is shared over a plurality of items of component shape data. The nozzle name, the part dimensions, and the like are indicated in the nozzle specification data. For example, the releasing dimension Lm when the pair of claw sections 51 and 52 are released, the minimum separation dimension when the pair of claw sections 51 and 52 are closed, and the like are indicated in the nozzle specification data of the mechanical chuck nozzle 1. For example, the size of suction opening section and the like are indicated in the nozzle specification data of the suction nozzle.

Figure 7:
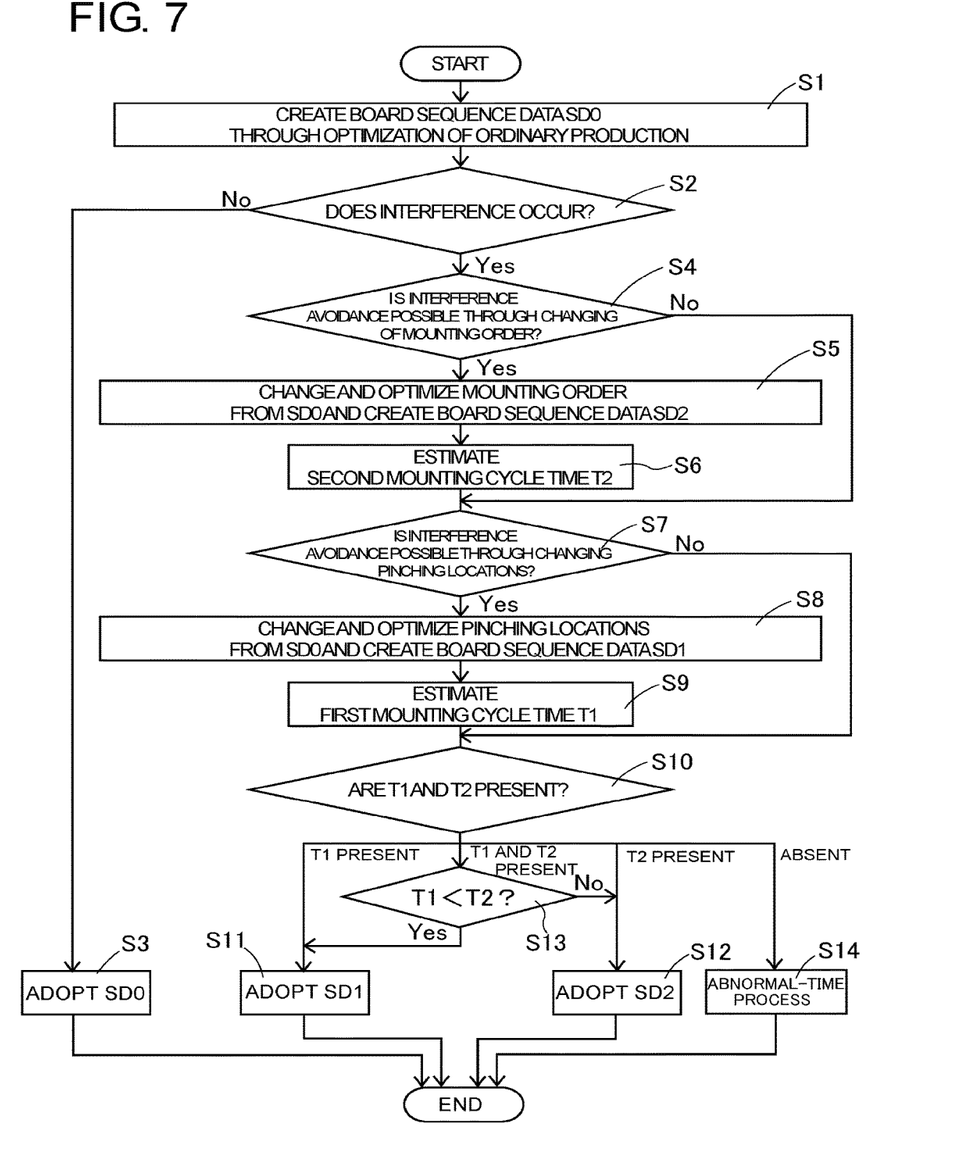
FIG. 7 is a diagram illustrating a calculation process flow of optimization and interference avoidance of board sequence data.

Before starting the production of the board, the computer performs the calculation process of the optimization and the interference avoidance of the board sequence data. FIG. 7 is a diagram illustrating a calculation process flow of the optimization and the interference avoidance of board sequence data. In step S1 of FIG. 7, the computer generates board sequence data SD0 according to the optimization of an ordinary production. The optimization of the ordinary production means minimizing the mounting cycle time without considering the interference of the mechanical chuck nozzle 1 to the mounted components. The mounting cycle time is the time which is anticipated to be necessary for mounting all of the plurality of components on the board. The mounting cycle time is a sum value of the exchanging time of the suction nozzle and the mechanical chuck nozzle 1 in the mounting head 9 of the component transfer device, the component pick up time of each nozzle, the movement time, the component mounting time, and the like. Therefore, the mounting cycle time depends on the mounting order of the plurality of components, the order in which the types of components are arranged in a plurality of component supply positions of the component supply device, and the like. Various well-known techniques may be adapted to carry out the optimization of the ordinary production.

In the next step S2, the computer determines whether or not interference of the mechanical chuck nozzle 1 with the mounted components occurs if the mounting of the components is carries out based on the board sequence data SD0. In a case in which the interference does not occur, the computer proceeds to step S3, determines the adoption of the board sequence data SD0, and ends the calculation process flow. In a case in which the interference occurs, the computer proceeds to step S4, and determines whether or not it is possible to avoid the interference by changing the mounting order. In a case in which the interference may be avoided, the computer proceeds to step S5, and in a case in which the interference may not be avoided, the computer proceeds to step S7.

In step S5, the computer changes the mounting order from the board sequence data SD0, avoids the interference, carries out the optimization again, and subsequently creates the board sequence data SD2. In the re-optimization, inspection is carried out as to whether a wasteful portion arises in the movement path of the mounting head 9 as a result of changing the mounting order. If, hypothetically, a wasteful portion arises, the mounting order of the components, the order in which the types of components are arranged, and the like are changed within a scope in which the interference avoidance is possible. The calculation process of steps S5 corresponds to the second method of the present disclosure. In the following step S6, the computer estimates a second mounting cycle time T2 when carrying out the mounting of the components based on the board sequence data SD2, and subsequently proceeds to step S7.

In step S7, the computer determines whether or not it is possible to avoid the interference by changing the pinching locations. In a case in which the interference may be avoided, the computer proceeds to step S8, and in a case in which the interference may not be avoided, the computer proceeds to step S10. In step S8, the computer changes the pinching locations from the board sequence data SD0, to avoid the interference, carries out the optimization again, and creates board sequence data SD1. The changing method of the pinching locations is already described in the first embodiment. In the re-optimization, after the pinching locations are changed, waste in the movement path of the mounting head 9, waste in the operation of the mechanical chuck nozzle 1, and the like are solved. The calculation process of step S8 corresponds to the first method of the present disclosure. In the following step S9, the computer estimates a first mounting cycle time T1 when carrying out the mounting of the components based on the board sequence data SD1, and subsequently proceeds to step S10.

In step S10, the computer inspects the presence or absence of the first mounting cycle time T1 and the second mounting cycle time T2. In a case in which only the first mounting cycle time T1 is present, the computer proceeds to step S11, determines that the board sequence data SD1 is to be adopted, and ends the calculation process flow. In a case in which only the second mounting cycle time T2 is present, the computer proceeds to step S12, determines that the board sequence data SD2 is to be adopted, and ends the calculation process flow. In a case in which both the first mounting cycle time T1 and the second mounting cycle time T2 are present, the computer proceeds to step S13, and compares the magnitude of the first mounting cycle time T1 and the second mounting cycle time T2. If the first mounting cycle time T1 is smaller, the computer proceeds to step S11, and if this is not the case, the computer proceeds to step S12. Accordingly, the computer may determine that the board sequence data which has the smaller mounting cycle time is to be adopted.

In a case in which both the first mounting cycle time T1 and the second mounting cycle time T2 are absent, the computer proceeds to step S14, carries out an abnormal-time process, and ends the calculation process flow. In the abnormal-time process, for example, notification is performed that the interference may not be avoided. In this case, the interference may not be avoided by changing the mounting order and changing the pinching locations. Therefore, a countermeasure such as using a special mechanical chuck nozzle, changing the design of the component arrangement on the board, or the like becomes necessary.

In the component mounting method of the second embodiment, the standard pinching locations of the component are defined as the body center data and the standard angle data inside the component shape data which holds the various values which relate to the shape of the component. The actual pinching locations of the component are defined as the pinching center deviation data and the angle data inside the board sequence data which defines the mounting order and the mounting coordinate positions of the plurality of components to be mounted to the board.

Accordingly, the standard pinching locations are defined in unique component shape data for each type of component, and the actual pinching locations which may change depending on the type of the board are defined individually for each corresponding item of board sequence data. Therefore, since there may be only one type of the component shape data regardless of changes to the actual pinching locations, the management of the data is simple and errors do not arise. In comparison, the actual pinching locations are defined in the component shape data in the related art. Therefore, it is necessary to produce new component shape data every time the actual pinching locations change. Therefore, a plurality of items of component shape data coexist even with a single type of component, management of the data becomes complicated, and errors arise often.

In the component mounting method of the second embodiment, when a required time for mounting the plurality of components onto the board is called a mounting cycle time, and in a case in which at least one of positions and a release operation of the pair of claw sections 51 and 52 interferes with the mounted components if the pair of claw sections 51 and 52 pinch the standard pinching locations of the component, the first mounting cycle time T1 which avoids the interference using a first method (step S8) of changing the pinching locations of the component from the standard pinching locations is estimated, the second mounting cycle time T2 which avoids the interference using a second method (step S5) of changing a mounting order of the plurality of components which is defined in the board sequence data is estimated, and the method with a shorter time among the first mounting cycle time T1 and the second mounting cycle T2 time is adopted.

Accordingly, it is possible to adopt a suitable method in order to avoid the interference of the pair of claw sections 51 and 52 with the mounted components, and shorten the time of mounting cycle time. Therefore, it is possible to secure favorable production efficiency while avoiding the interference.

In the first embodiment, the pinching locations may be changed using another method of exchanging the mechanical chuck nozzle 1 for a dedicated mechanical chuck nozzle, keeping the pinching center deviation data as zero data when the interference occurs. The dedicated mechanical chuck nozzle is a mechanical chuck nozzle obtained by parallel movement (movement in the obverse-reverse direction of the paper surface of FIG. 1) of the arrangement position of the pair of claw sections 51 and 52 in relation to the main body section 2 of the mechanical chuck nozzle 1 by the deviation amount Y1. The mechanical chuck nozzle 1 which is described in the first embodiment is an example of the component mounting tool which pinches a component using a plurality of claw sections, and a component mounting tool of a different configuration may be adopted. In addition, various modifications and adaptations may be made to the present disclosure.

REFERENCE SIGNS LIST

1: mechanical chuck nozzle (component mounting tool), 2: main body section, 3: air driving section, 4: pinching mechanism section, 51, 52: claw section, 9: mounting head, Lm: releasing dimension, K: board, P1: rectangular component, P2: component, P21: body, P22: terminal section, P11: large component (mounted components), P12, P13: rectangular component, P14, P15: hexagonal component, C1, C2, C12 to C15: center of component external shape, C3: center of body of component, R1 to R4: standard pinching location, W12: pinching center, Y1: deviation amount

The invention claimed is:

1. A component mounting method for using a component mounting tool which includes a plurality of claw sections that pinch and pick up a component at a component supply position, and release the component on a board to mount the component onto a predetermined position of the board, and the component mounting tool being mounted to be movable between the component supply position and the board, the method comprising:
   determining pinching locations of the component to be pinched by the plurality of claw sections such that positions and a release operation of the plurality of claw sections do not interfere with mounted components which are already mounted on the board when the plurality of claw sections release the component;
   defining standard pinching locations at which the component is ordinarily pinched by the plurality of claw sections;
   when the standard pinching locations of the component interfere with the mounted components during at least one of positions and a release operation of the plurality of claw sections, changing the standard pinching locations of the component to final pinching locations of the component to avoid interference; and
   pinching the component at the final pinching locations and mounting the component onto the board by the plurality of claw sections.

2. The component mounting method according to claim 1, wherein the standard pinching locations of the component are defined as side surfaces of a body of the component, and are defined using body center data which indicates a center of the body, and standard angle data which indicates directional angles at which the standard pinching locations lie based on the center of the body as a reference,
   wherein the pinching locations of the component are defined using pinching center deviation data which indicates a deviation amount of a pinching center which is deviated from the center of the body of the component, and angle data which indicates the directional angles at which the pinching locations lie based on the pinching center as a reference,
   wherein the pinching center deviation data is set to zero data and the angle data is caused to match the standard angle data when the pinching locations of the component are not changed from the standard pinching locations, and
   wherein at least one change of a pinching center change in which the pinching center deviation data is set to non-zero data and an angle change in which the angle data is set to data which is different from the standard angle data when the pinching locations of the component are changed from the standard pinching locations is performed.

3. The component mounting method according to claim 2, wherein the standard pinching locations of the component are defined by component shape data which holds various values relating to a shape of the component, and
   wherein the pinching locations of the component are defined in board sequence data which defines a mounting order and mounting coordinate positions of a plurality of components to be mounted onto the board.

4. The component mounting method according to claim 1, wherein the standard pinching locations of the component are defined by component shape data which holds various values relating to a shape of the component, and
   wherein the pinching locations of the component are defined in board sequence data which defines a mounting order and mounting coordinate positions of a plurality of components to be mounted onto the board.

5. The component mounting method according to claim 4, wherein a required time for mounting the plurality of components onto the board is called a mounting cycle time, and
   wherein in a case in which at least one of positions and a release operation of the plurality of claw sections interferes with the mounted components when the plurality of claw sections pinch the standard pinching locations of the component,
     a first mounting cycle time of a case in which the interference is avoided using a first method of changing the pinching locations of the component from the standard pinching locations is estimated,
     a second mounting cycle time of a case in which the interference is avoided using a second method of changing a mounting order of the plurality of components which is defined in the board sequence data is estimated, and
     the method with a shorter time among the first mounting cycle time and the second mounting cycle time is adopted.

6. A component mounting device comprising:
   a component mounting tool which includes a plurality of claw sections that pinch and pick up a component at a component supply position, and release the component on a board to mount the component onto a predetermined position of the board, and the component mounting tool being mounted to be movable between the component supply position and the board; and
   a pinching location determination device to determine pinching locations of the component to be pinched by the plurality of claw sections such that positions and a release operation of the plurality of claw sections do not interfere with mounted components which are already mounted on the board when the plurality of claw sections release the component, and to define standard pinching locations at which the component is ordinarily pinched by the plurality of claw sections,
   wherein when the standard pinching locations of the component interfere with the mounted components during at least one of positions and a release operation of the plurality of claw sections, the pinching location determination device changes the standard pinching locations of the component to final pinching locations of the component to avoid interference.

7. A component mounting device comprising:
a component mounting tool which includes a plurality of claw sections that pinch and pick up a component at a component supply position, and release the component on a board to mount the component onto a predetermined position of the board, and the component mounting tool being mounted to be movable between the component supply position and the board; and
circuitry configured to determine pinching locations of the component to be pinched by the plurality of claw sections such that positions and a release operation of the plurality of claw sections do not interfere with mounted components which are already mounted on the board when the plurality of claw sections release the component, and to define standard pinching locations at which the component is ordinarily pinched by the plurality of claw sections,
wherein when the standard pinching locations of the component interfere with the mounted components during at least one of positions and a release operation of the plurality of claw sections, the circuitry is configured to change the standard pinching locations of the component to final pinching locations of the component to avoid interference.

8. The component mounting device according to claim 7,
wherein the standard pinching locations of the component are defined by component shape data which holds various values relating to a shape of the component, and
wherein the pinching locations of the component are defined in board sequence data which defines a mounting order and mounting coordinate positions of a plurality of components to be mounted onto the board.

9. The component mounting device according to claim 8,
wherein a required time for mounting the plurality of components onto the board is called a mounting cycle time, and
wherein in a case in which at least one of positions and a release operation of the plurality of claw sections interferes with the mounted components when the plurality of claw sections pinch the standard pinching locations of the component,
the circuitry is configured to estimate a first mounting cycle time of a case in which the interference is avoided using a first method of changing the pinching locations of the component from the standard pinching locations,
the circuitry is configured to estimate a second mounting cycle time of a case in which the interference is avoided using a second method of changing a mounting order of the plurality of components which is defined in the board sequence data, and
the circuitry is configured to adopt the method with a shorter time among the first mounting cycle time and the second mounting cycle time.

10. The component mounting device according to claim 7,
wherein the standard pinching locations of the component are defined as side surfaces of a body of the component, and are defined using body center data which indicates a center of the body, and standard angle data which indicates directional angles at which the standard pinching locations lie based on the center of the body as a reference,
wherein the pinching locations of the component are defined using pinching center deviation data which indicates a deviation amount of a pinching center which is deviated from the center of the body of the component, and angle data which indicates the directional angles at which the pinching locations lie based on the pinching center as a reference,
wherein the circuitry is configured to set the pinching center deviation data to zero data and to cause the angle data to match the standard angle data when the pinching locations of the component are not changed from the standard pinching locations, and
wherein the circuitry is configured to perform at least one change of a pinching center change in which the pinching center deviation data is set to non-zero data and an angle change in which the angle data is set to data which is different from the standard angle data when the pinching locations of the component are changed from the standard pinching locations.

11. The component mounting device according to claim 10,
wherein the standard pinching locations of the component are defined by component shape data which holds various values relating to a shape of the component, and
wherein the pinching locations of the component are defined in board sequence data which defines a mounting order and mounting coordinate positions of a plurality of components to be mounted onto the board.

* * * * *